(12) United States Patent  
Kuroda

(10) Patent No.: US 9,053,950 B2
(45) Date of Patent: Jun. 9, 2015

(54) ELECTRONIC CIRCUIT

(75) Inventor: Tadahiro Kuroda, Kanagawa (JP)

(73) Assignee: Keio University, Tokyo (JP)

( * ) Notice: Subject to any disclaimer, the term of this patent is extended or adjusted under 35 U.S.C. 154(b) by 1415 days.

(21) Appl. No.: 12/734,811

(22) PCT Filed: Nov. 20, 2008

(86) PCT No.: PCT/JP2008/071159
§ 371 (c)(1),
(2), (4) Date: Oct. 19, 2010

(87) PCT Pub. No.: WO2009/069532
PCT Pub. Date: Jun. 4, 2009

(65) Prior Publication Data
US 2011/0039493 A1    Feb. 17, 2011

(30) Foreign Application Priority Data
Nov. 26, 2007   (JP) ................ 2007-305143

(51) Int. Cl.
*H04B 5/00*   (2006.01)
*H04B 7/00*   (2006.01)
(Continued)

(52) U.S. Cl.
CPC ..... *H01L 25/0657* (2013.01); *H01L 2223/6677* (2013.01); *H01L 2224/48091* (2013.01);
(Continued)

(58) Field of Classification Search
CPC ........... H01L 2224/48091; H01L 2924/00014; H01L 2223/6677; H01L 2224/32145; H01L 2224/73265; H01L 2225/0651; H01L 2225/06527; H01L 2225/06562; H01L 25/0657; H01L 2924/01004; H01L 2924/01019

USPC .................................... 455/41.1, 41.2
See application file for complete search history.

(56) References Cited

U.S. PATENT DOCUMENTS 5,701,037 A * 12/1997 Weber et al. ............ 257/777
2006/0176624 A1   8/2006 Kuroda et al.
(Continued)

FOREIGN PATENT DOCUMENTS

JP   11-068033 A    3/1999
JP   2002-217356 A   8/2002
(Continued)

OTHER PUBLICATIONS

D. Mizoguchi et al., "A 1.2Gb/s/pin Wireless Superconnect Based on Inductive Inter-chip Signaling (IIS)," IEEE International Solid-State Circuits Conference (ISSCC 2004), Dig. Tech. Papers, pp. 142-143, 517 (Feb. 2004).
(Continued)

*Primary Examiner* — Ping Hsieh
*Assistant Examiner* — Xin Jia
(74) *Attorney, Agent, or Firm* — Fishman Stewart Yamaguchi PLLC

(57) ABSTRACT

By stacking and mounting a second substrate 20 having the same structure as that of a first substrate 10 on the first substrate upon rotating the second substrate by 180 degrees and sliding the second substrate, an antenna 11 and an antenna 22 overlap each other and an antenna 12 and an antenna 21 overlap each other and communications in each of these combinations are enabled, and a space for wire bondings 16 is secured. Accordingly, communications between the substrates are made via the antennas, and further, a space for wire bondings is secured on each substrate, wireless communications are carried out between substrates which have the same basic structure and are stacked and mounted, and power can be supplied via the wire bondings.

11 Claims, 20 Drawing Sheets

(51) Int. Cl.
*H01L 25/065* (2006.01)
*H01Q 1/22* (2006.01)

(52) U.S. Cl.
CPC ............ *H01L2224/73265* (2013.01); *H01L 2225/0651* (2013.01); *H01L 2225/06527* (2013.01); *H01L 2225/06562* (2013.01); *H01L 2924/01004* (2013.01); *H01L 2924/19041* (2013.01); *H01L 2924/30107* (2013.01); *H01Q 1/2283* (2013.01); *H01L 2224/32145* (2013.01); *H01L 2924/01019* (2013.01)

(56) References Cited

U.S. PATENT DOCUMENTS

| | | | |
|---|---|---|---|
| 2006/0176676 A1 | 8/2006 | Kuroda et al. | |
| 2007/0254455 A1* | 11/2007 | Yamaguchi et al. | 438/455 |
| 2007/0274198 A1 | 11/2007 | Kuroda et al. | |
| 2007/0289772 A1 | 12/2007 | Kuroda et al. | |
| 2008/0150834 A1* | 6/2008 | Sukegawa et al. | 343/893 |
| 2008/0258744 A1 | 10/2008 | Kuroda et al. | |
| 2009/0050941 A1* | 2/2009 | Yamazaki et al. | 257/255 |
| 2009/0057039 A1 | 3/2009 | Kuroda et al. | |

FOREIGN PATENT DOCUMENTS

| | | |
|---|---|---|
| JP | 2005-228981 A | 8/2005 |
| JP | 2005-348264 A | 12/2005 |
| JP | 2006-050354 A | 2/2006 |
| JP | 2006-066454 A | 3/2006 |
| JP | 2006-105630 A | 4/2006 |
| JP | 2006-173986 A | 6/2006 |

OTHER PUBLICATIONS

N. Miura et al., "Analysis and Design of Transceiver Circuit and Inductor Layout for Inductive Inter-chip Wireless Superconnect," Symposium on VLSI Circuits, Dig. Tech. Papers, pp. 246-249 (Jun. 2004).

N. Miura et al., "Cross Talk Countermeasures in Inductive Inter-Chip Wireless Superconnect," in Proc. IEEE Custom Integrated Circuits Conference (CICC 2004), pp. 99-102 (Oct. 2004).

N. Miura et al., "A 195Gb/s 1.2W 3D-Stacked Inductive Inter-Chip Wireless Superconnect with Transmit Power Control Scheme," IEEE International Solid-State Circuits Conference (ISSCC 2005), Dig. Tech. Papers, pp. 264-265 (Feb. 2005).

N. Miura et al., "A 1Tb/s 3W Inductive-Coupling transceiver for Inter-Chip Clock and Data Link," IEEE International Solid-State Circuits Conference (ISSCC 2006), Dig. Tech. Papers, pp. 424-425 (Feb. 2006).

N. Miura et al., "A 0.14pJ/b Inductive-Coupling Inter-Chip Data Transceiver with Digitally-Controlled Precise Pulse Shaping", IEEE International Solid-State Circuits Conference (ISSCC 2007), Dig. Tech. Papers, pp. 264-265 (Feb. 2007).

International Search Report mailed on 02/19/09.

Office Action issued in Japanese Application No. 2009-543770, dated Dec. 4, 2013.

* cited by examiner

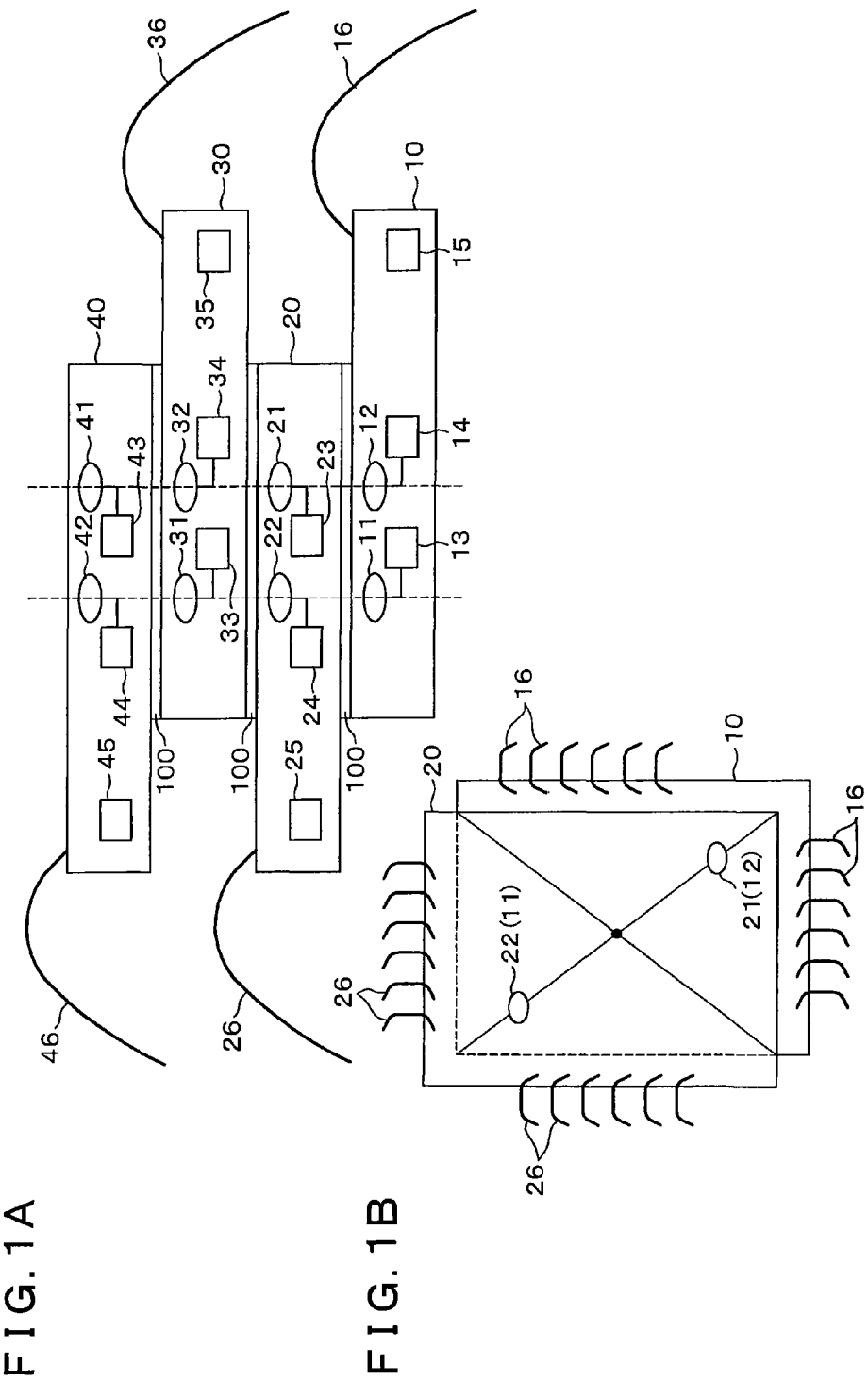

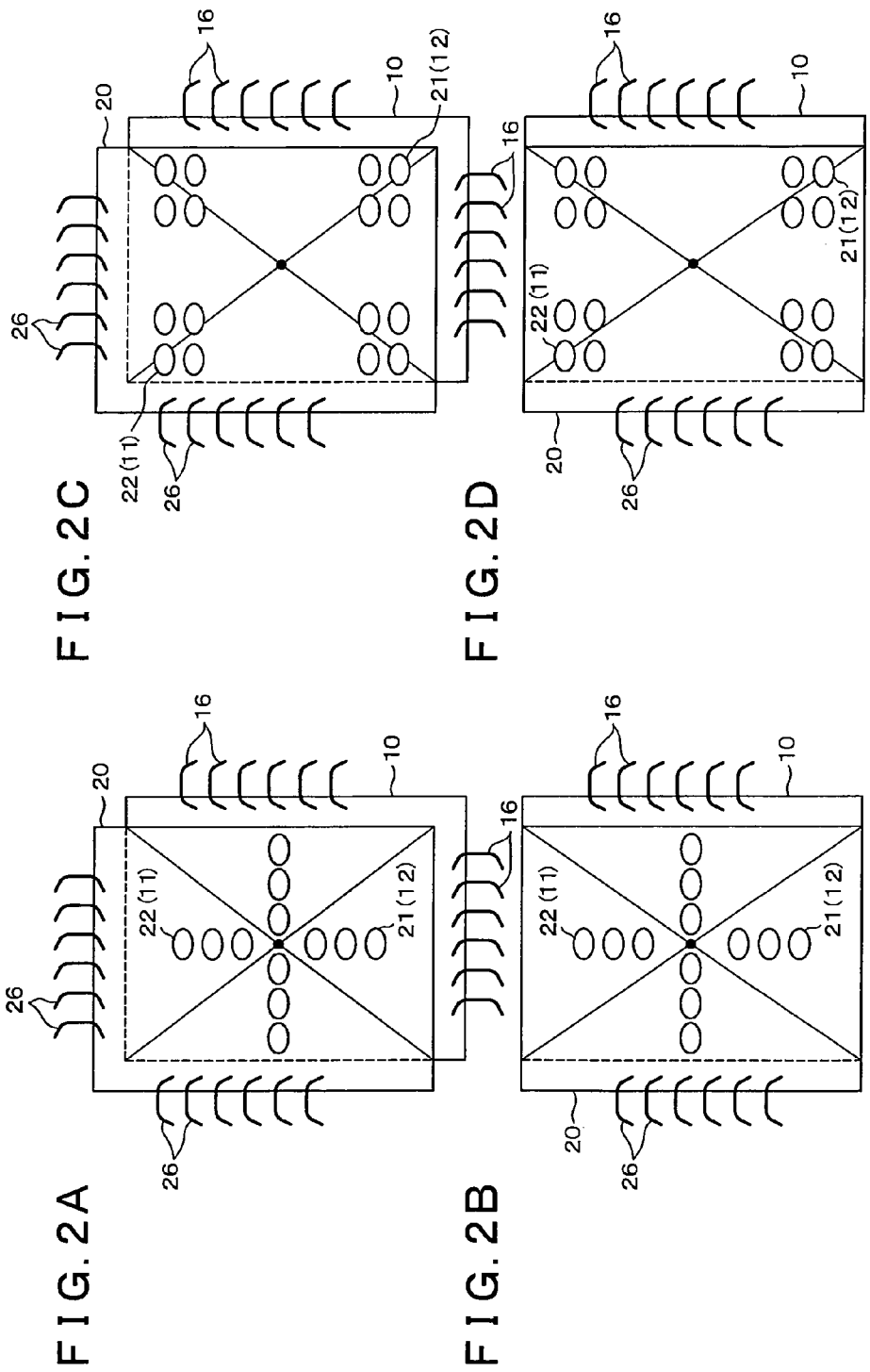

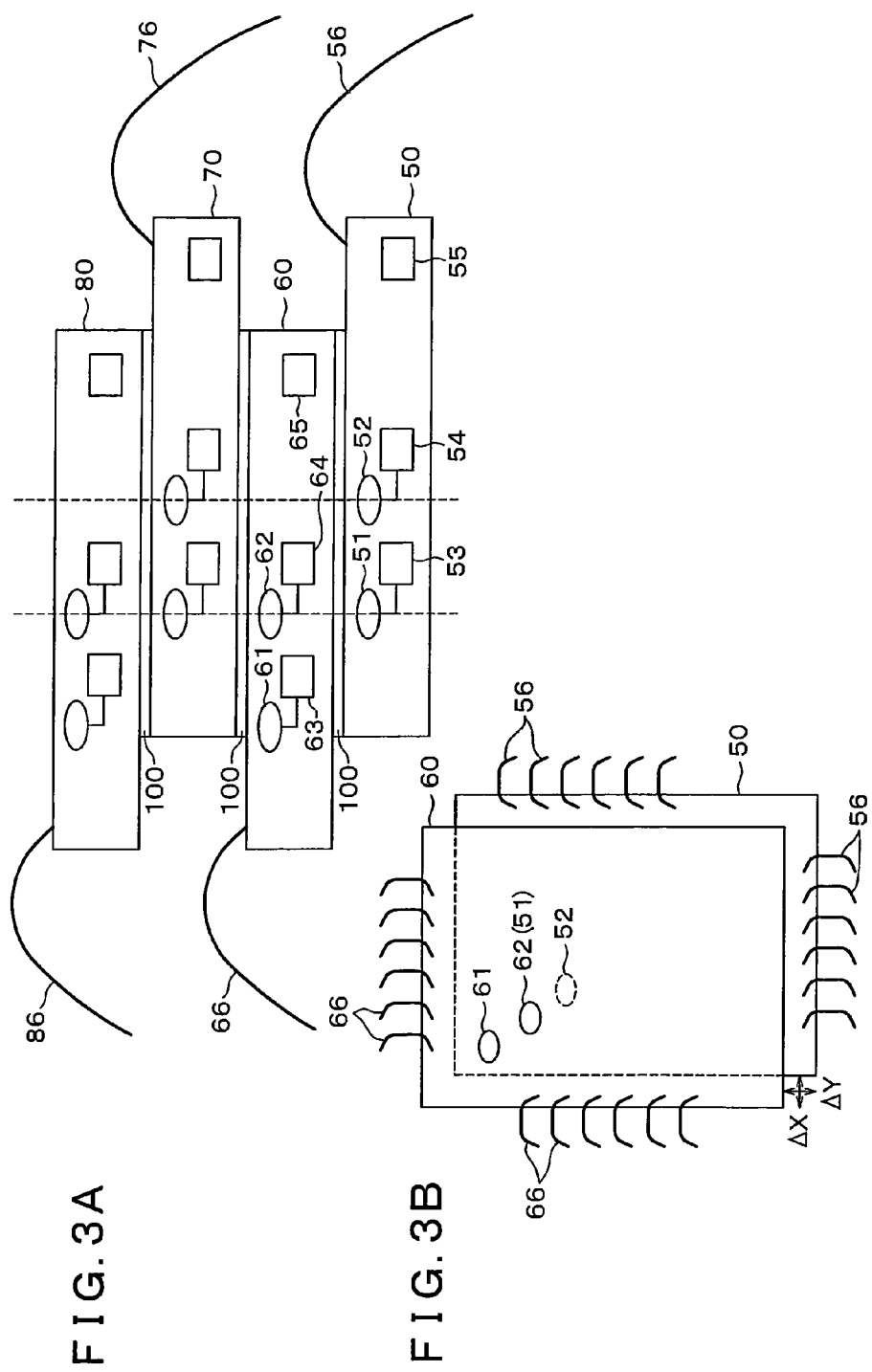

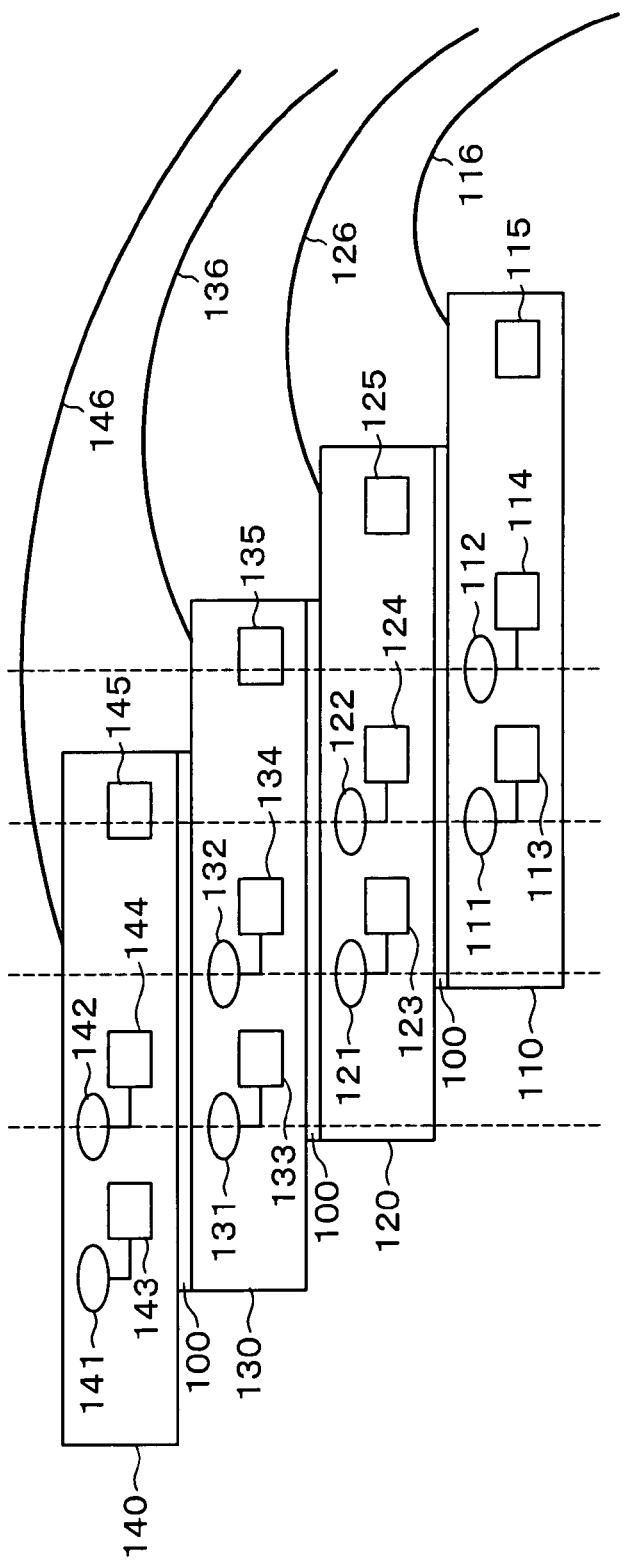

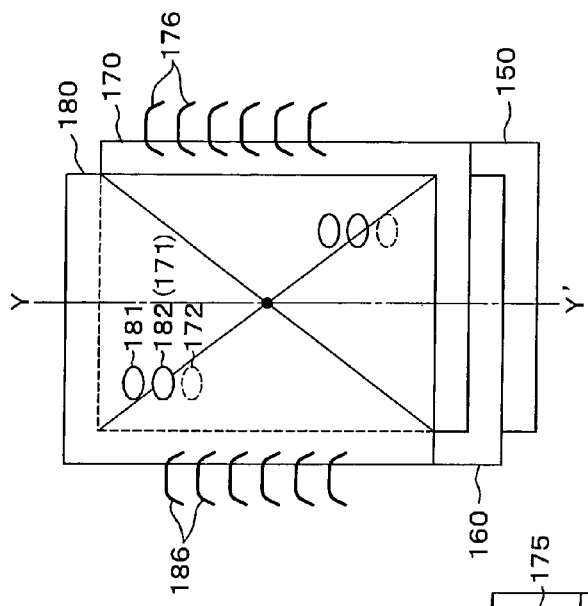
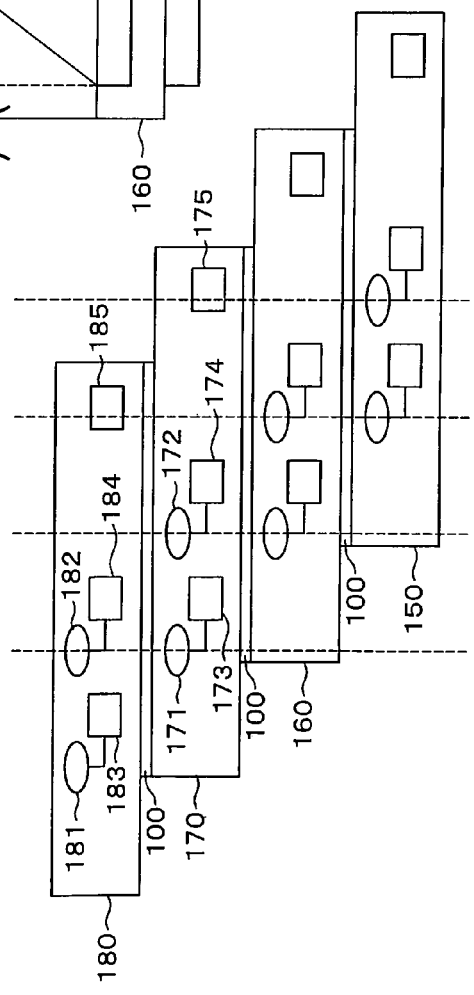
FIG. 5B
FIG. 5A

FIG. 14

| | CONTROL (1) | (2) | (3) |
|---|---|---|---|
| SUBSTRATE (40) | Rx | | |
| SUBSTRATE (30) | Rx | Tx | Rx |
| SUBSTRATE (20) | Rx | | |
| SUBSTRATE (10) | Rx | | |
| CONTOROL SUBSTRATE | Tx | Rx | Tx |
| OUTSIDE | | | |

FIG. 16

| | CONTROL | (1) | (2) | (3) |
|---|---|---|---|---|
| SUBSTRATE (440) | Tx | Tx | Rx | Rx |
| SUBSTRATE (430) | Rx | | Tx | Rx |
| SUBSTRATE (420) | Rx | Rx | | |
| SUBSTRATE (410) | Rx | | | Tx |

OUTSIDE

FIG. 17

| | CONTROL | (1) | (2) | (3) |
|---|---|---|---|---|
| SUBSTRATE(440) | Tx | Tx | | |
| SUBSTRATE(430) | Rx | Rx | Tx | |
| SUBSTRATE(420) | Rx | | Rx | Tx |
| SUBSTRATE(410) | Rx | | | Rx |
| OUTSIDE | | | | |

FIG.18

|  | CONTROL/DATA | | |
|---|---|---|---|
|  | (1) | (2) | (3) |
| SUBSTRATE (440) | Tx/Tx | | |
| SUBSTRATE (430) | Rx/Rx | Tx/Tx | |
| SUBSTRATE (420) | | Rx/Rx | Tx/Tx |
| SUBSTRATE (410) | | | Rx/Rx |

OUTSIDE

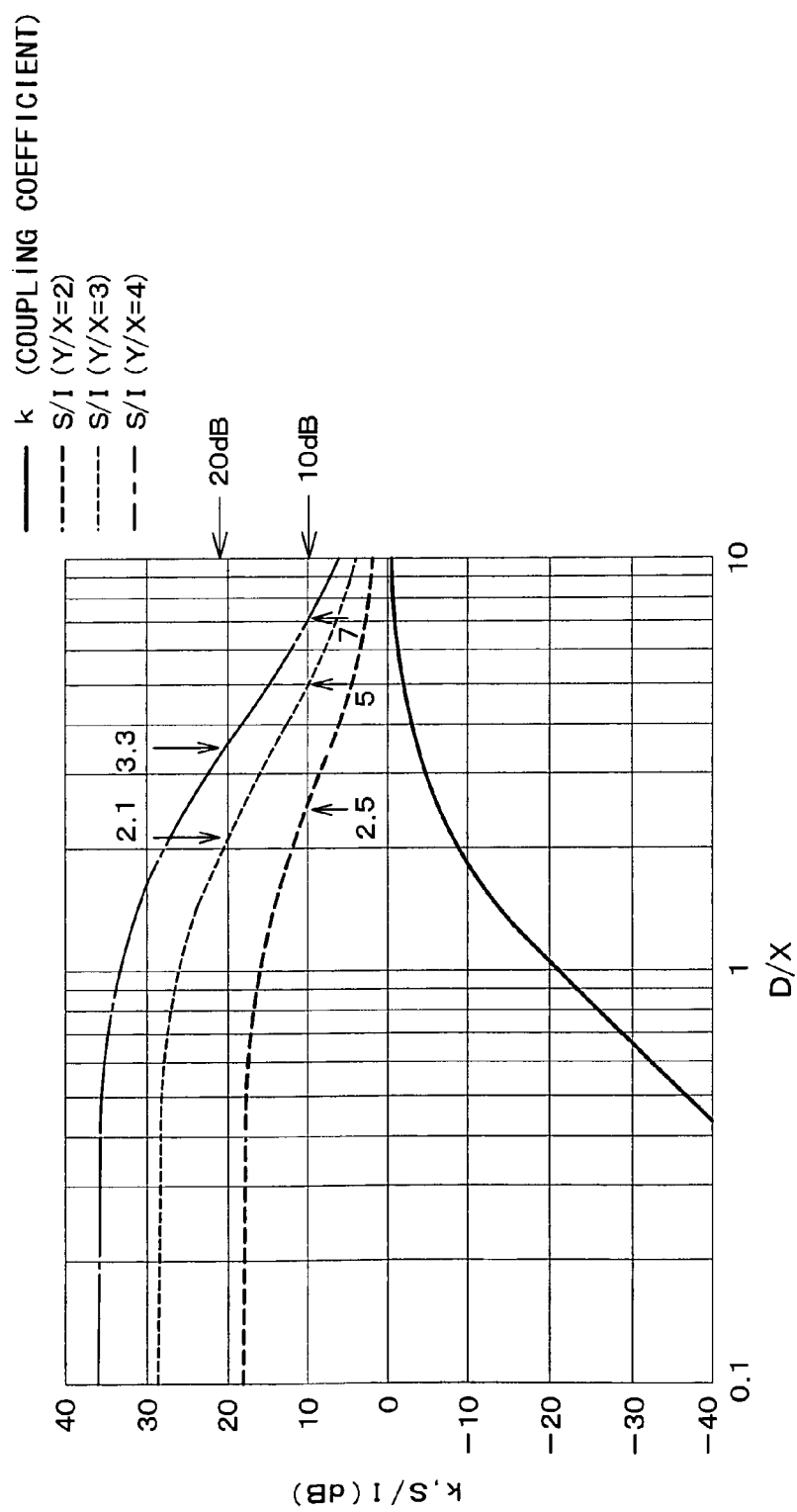

ELECTRONIC CIRCUIT

TECHNICAL FIELD

The present invention relates to an electronic circuit capable of suitably carrying out communications between substrates such as IC (Integrated Circuit) bare chips.

BACKGROUND ART

The present inventors have proposed an electronic circuit that carries out communications by inductive coupling between substrates to be stacked and mounted via coils formed by wiring on the substrates of LSI (Large Scale Integration) chips (refer to Patent Literature 1).
[Patent Literature 1] JP 2005-228981 A

SUMMARY OF INVENTION

Technical Problem

However, if substrates are electrically connected to each other only by wireless communications by inductive coupling, etc., power supply, etc., incompatible with inductive coupling is also carried out by inductive coupling and the efficiency is deteriorated.

In view of the above-described problem, an object of the present invention is to provide an electronic circuit capable of carrying out wireless communications between substrates which have the same basic structure and are stacked and mounted and carrying out power supply, etc., by wire bondings.

Solution to Problem

An electronic circuit of the present invention comprises a first substrate on which first and second antennas are formed at a predetermined interval; and a second substrate which has the same external shape as that of the first substrate, and on which third and fourth antennas are formed at positions of the first and second antennas formed on the first substrate, and which is stacked and mounted on the first substrate so as to carry out wireless communications between the first antenna and the fourth antenna and have a portion not overlapping the first substrate.

By stacking and mounting the first substrate and the second substrate in directions 90 degrees or 180 degrees different from each other, spaces for wire bondings can be easily secured.

The electronic circuit further comprises a means for giving information on the layer positions of the first and second substrates to the substrates from the outside, and accordingly, information on the layer positions can be given to the substrates by a simple configuration.

The electronic circuit further comprises a control substrate which includes a control antenna for communicating with the first and fourth antennas, and controls data communications between the first substrate and the second substrate or data communications between the first and second substrates and the outside, and accordingly, the substrates other than the control substrate do not need to be loaded with a control function, and a greater capacity can be directed for the original function such as a storage memory.

The control substrate has the same external shape as that of the first and second substrate, so that the substrates can be formed by substrates with the same structure, and manufacturing becomes easy.

The control substrate controls data communications with the outside by randomly accessing the first and second substrates, and accordingly, high-speed processing can be realized especially in use as a memory etc.

The control substrate controls random access data communications between the first and the second substrates, and accordingly, high speed processing can be realized especially in use as a CPU etc.

The electronic circuit further comprises a third substrate which has the same external shape as that of the first and second substrates, on which fifth and sixth antennas are formed at the positions of the first and second antennas formed on the first substrate, and which carries out wireless communications between the third antenna and the sixth antenna, and is stacked and mounted on the second substrate so as to have the second substrate to be sandwiched by the first substrate and the third substrate and have a portion not overlapping the second substrate, wherein the electronic circuit carries out successive data transfer from the first substrate to the second substrate according to control by the first substrate and from the second substrate to the third substrate according to control by the second substrate, and accordingly, control communications are carried out only between adjacent substrates, so that the distance of control communications can be shortened.

The electronic circuit further comprises a third substrate which has the same external shape as that of the first and second substrates, on which fifth and sixth antennas are formed at the positions of the first and second antennas formed on the first substrate, and which carries out wireless communications between the third antenna and the sixth antenna, and is stacked and mounted on the second substrate so as to have the second substrate to be sandwiched by the first substrate and the third substrate and have a portion not overlapping the second substrate, wherein the electronic circuit carries out successive data transfer from the first substrate to the second substrate and from the second substrate to the third substrate according to control by the control substrate, and accordingly, the substrates other than the control substrate do not need to be loaded with a control function, and a greater capacity can be directed for the original function such as a storage memory.

Two or more first substrates and second substrates are alternately stacked and mounted, the first and fourth antennas of the substrates are disposed so as to overlap each other, and a plurality of communications are simultaneously carried out via the antennas separated so as not to cause interference, and accordingly, high-speed processing can be realized by parallel communications.

The antennas consist of coils, and include a first coil which transmits a signal to a second coil, the second coil which receives the signal and a third coil which overlaps the first and second coils and performs transmission separately in synchronization with the first coil, and the diameters of the first to third coils are not less than a predetermined diameter corresponding to a distance between the first coil and the second coil, and not more than a predetermined diameter by which reception of a signal by the second coil from the third coil remains at an intensity having no influence on reception of a signal from the first coil and which depends on a distance between the second coil and the third coil, and accordingly, a plurality of communications can be carried out among four or more coils overlapping and stacked.

Advantageous Effects of Invention

According to the present invention, an electronic circuit capable of carrying out wireless communications between substrates which have the same basic structure and are stacked and mounted and carrying out power supply, etc., by wire bonding, can be provided.

BRIEF DESCRIPTION OF DRAWINGS

FIG. 1A and FIG. 1B are views depicting a configuration of an electronic circuit according to Example 1 of the present invention.

FIG. 2A to FIG. 2D are top views depicting configurations of an electronic circuit according to Example 2 of the present invention.

FIG. 3A and FIG. 3B are views depicting a configuration of an electronic circuit according to Example 3 of the present invention.

FIG. 4 is a schematic sectional view depicting a configuration of an electronic circuit according to Example 4 of the present invention.

FIG. 5A and FIG. 5B are schematic sectional views depicting a configuration of an electronic circuit according to Example 5 of the present invention.

FIG. 14 is a view describing communications in the Example 8 of the present invention.

FIG. 16 is a view describing communications (#1) in the Example 12 of the present invention.

FIG. 17 is a view describing communications (#2) in the Example 12 of the present invention.

FIG. 18 is a view describing communications (#3) in the Example 12 of the present invention.

FIG. 20 is a view depicting a relationship among a coil diameter, a coil-to-coil distance and a signal transmission intensity.

Figure 6:
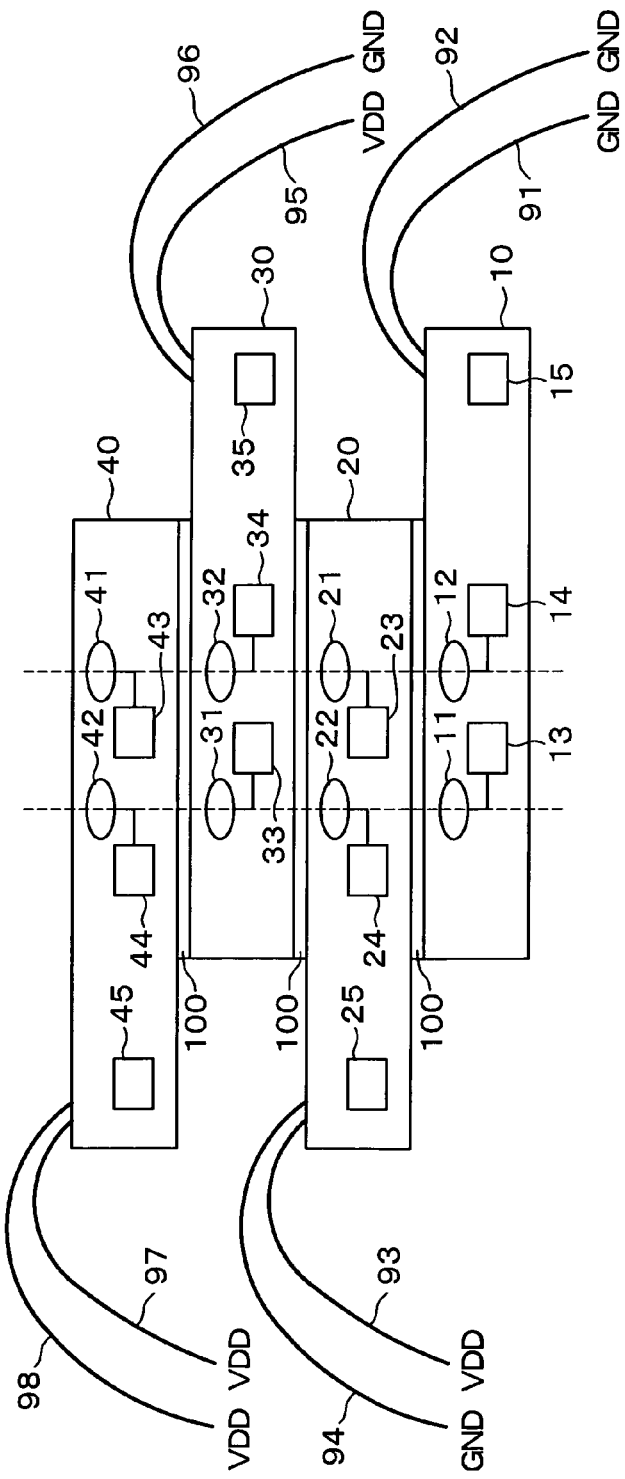
FIG. 6 is a schematic sectional view depicting a configuration of an electronic circuit according to Example 6 of the present invention.

REFERENCE SIGNS LIST 10, 20, 30, 40, 50, 60, 70, 80, 110, 120, 130, 140, 150, 160, 170, 180, 310, 320, 330, 340, 350, 360, 370, 380, 410, 420, 430, 440, 510, 520, 530, 540, 550, 610, 620, 630, 640, 650, 660, 670, 680 Substrate
250, 260, 390, 690 Control substrate
11, 12, 21, 22, 31, 32, 41, 42, 51, 52, 61, 62, 111, 112, 121, 122, 131, 132, 141, 142, 171, 172, 181, 182, 221, 222, 241, 242, 551, 552, 611, 612, 621, 622 Antenna
251, 252, 261, 262, 691, 692, 693 Control antenna
13, 14, 23, 24, 33, 34, 43, 44, 53, 54, 63, 34, 113, 114, 123, 124, 133, 134, 43, 144, 173, 174, 183, 184, 253, 254, 263, 264 Transmitter-receiver
15, 25, 35, 45, 55, 65, 115, 125, 135, 145, 175, 185, 615, 625 ID device
16, 26, 36, 46, 56, 66, 76, 86, 91, 92, 93, 94, 95, 96, 97, 98, 116, 126, 136, 146, 176, 186, 216, 226, 236, 246, 256, 316, 326, 336, 346, 356, 366, 376, 386, 396, 416, 426, 436, 446, 516, 526, 536, 546, 556, 616, 626, 636, 646, 656, 666, 676, 686, 696 Wire bonding
17, 18, 27, 28 Selector
100 Adhesive

DESCRIPTION OF EMBODIMENTS

Hereinafter, a best mode for carrying out the present invention will be described with reference to the accompanying drawings.

Example 1

FIG. 1A and FIG. 1B are views depicting a configuration of an electronic circuit according to Example 1 of the present invention. FIG. 1A is a schematic sectional view from the lateral side of an electronic circuit formed by stacking and mounting. FIG. 1B is a top view of the electronic circuit including two substrates stacked and mounted. The electronic circuit of this Example 1 includes a first substrate 10, a second substrate 20, a third substrate 30 and a fourth substrate 40. The first substrate 10 has a first antenna 11, a second antenna 12, a first transmitter-receiver 13, a second transmitter-receiver 14 and a first ID device 15, and is supplied with power by wire bondings 16. The second substrate 20 similarly includes a third antenna 21, a fourth antenna 22, a third transmitter-receiver 23, a fourth transmitter-receiver 24 and a second ID device 25, and is supplied with power by wire bondings 26. The first ID device 15 and the second ID device 25 have information showing which layer positions the substrates are at. This will be described in detail with reference to FIG. 6. The third antenna 21 and the fourth antenna 22 on the second substrate 20 are respectively disposed at the positions of the first antenna 11 and the second antenna 12 on the first substrate 10, and thus, the basic structures of the first substrate 10 to the fourth substrate 40 are the same. When stacking and mounting the second substrate 20 on the first substrate 10 by using an adhesive 100, in the present example, the second substrate 20 is rotated by 180 degrees with respect to the first substrate 10 and slid so that, as shown in FIG. 1B, the first antenna 11 and the fourth antenna 22 overlap each other, and the second antenna 12 and the third antenna 21 overlap each other. Accordingly, a space for the wire bondings 16 on the substrate 10 is secured, and wire bonding becomes easy. This space is representatively at a position approximately 500 micrometers from the side. The third substrate 30 and the fourth substrate 40 are also rotated by 180 degrees with respect to the lower substrates, and then slid and stacked and mounted, and accordingly, upper and lower antennas can be made to overlap each other and spaces for wire bondings on the lower substrates can be secured. By adopting the above-described configuration, the first transmitter-receiver 13 and the fourth transmitter-receiver 24 can communicate with each other via the first antenna 11 and the fourth antenna 22, and the second transmitter-receiver 14 and the third transmitter-receiver 23 can communicate with each other via the second antenna 12 and the third antenna 21. Similarly, communications can be carried out between transmitter-receivers via arbitrary antennas disposed so as to overlap each other.

Example 2

FIG. 2A to FIG. 2D are views depicting configurations of an electronic circuit according to Example 2 of the present invention. FIG. 2A depicts an example in which antennas are arranged parallel to the sides of the substrates so that the antennas are arranged in a cross shape as a whole. In this FIG. 2A, the upper substrate 20 is slid to the diagonally upper left side, and on the other hand, in FIG. 2B, the upper substrate 20 is slid leftward. When the number of wire bondings can be small, the configuration of FIG. 2B can be adopted. FIG. 2C depicts an example in which antennas are arranged at four corners of the rectangular substrates. In FIG. 2C, the upper substrate 20 is slid to the diagonally upper left side, and on the other hand, in FIG. 2D, the upper substrate 20 is slid leftward.

Example 3

FIG. 3A and FIG. 3B are views depicting a configuration of an electronic circuit according to Example 3 of the present invention. FIG. 3A is a schematic sectional view from the lateral side of the electronic circuit formed by stacking and mounting. FIG. 3B is a top view of the electronic circuit in a state where two substrates are stacked and mounted. The electronic circuit of this Example 3 includes a fifth substrate 50, a sixth substrate 60, a seventh substrate 70 and an eighth substrate 80 which are similar to the substrates of the Example 1. The Example 1 shows an example in which the upper substrate is rotated and slid, however, the Example 3 shows an example in which the upper substrate is slid without being rotated. The basic configuration of the substrates is the same as that of the Example 1, however, in the Example 3, as shown in FIG. 3B, there are a case where wires are bonded to the right and lower sides of the substrate and a case where wires are bonded to the left and upper sides, so that design adaptable to both of these cases is necessary. In the Example 3, as shown in the figure, the antenna 51 and the antenna 62 overlap each other, however, no antenna on the sixth substrate 60 overlaps the antenna 52, and no antenna on the fifth substrate 50 overlaps the antenna 61. However, the antennas overlap antennas on substrates alternately, so that communications between these are possible.

Example 4

FIG. 4 is a schematic sectional view depicting a configuration of an electronic circuit according to Example 4 of the present invention. The electronic circuit of the Example 4 includes an eleventh substrate 110, a twelfth substrate 120, a thirteenth substrate 130 and a fourteenth substrate 140 which are similar to the substrates of the Example 1. The Example 3 shows an example in which substrates are alternately slid, however, the Example 4 shows an example in which the substrates are successively slid in the same direction. By adopting this configuration, most of the antennas can be arranged so as to overlap adjacent antennas. In the Example 4, one pair of antennas overlap each other, but do not overlap other antennas, so that simultaneous communications can be carried out without concern for crosstalk.

Example 5

FIG. 5A and FIG. 5B are schematic sectional views depicting a configuration of an electronic circuit according to Example 5 of the present invention. FIG. 5A is a schematic sectional view from the lateral side of the electronic circuit formed by stacking and mounting. FIG. 5B is a top view of an electronic circuit in a state where four substrates are stacked and mounted. FIG. 5A depicts a section along Y-Y' of FIG. 5B. The electronic circuit of the Example 5 includes a fifteenth substrate 150, a sixteenth substrate 160, a seventeenth substrate 170 and an eighteenth substrate 180 which are similar to the substrates of the Example 1. In the Example 5, the substrates are slid alternately to the left and right shown in the figure after being rotated by 180 degrees, and then successively slid to the same side in the up-down direction. In the Example 4, the sliding distance for wire bonding and the antenna-to-antenna distance must be equal to each other, however, in the Example 5, the sliding distance for wire bonding (in the left-right direction in FIG. 5B) and the antenna-to-antenna distance (in the up-down direction in FIG. 5B) can be set independently of each other. In FIG. 5A, all ID devices are shown on the right side, however, this is for convenience, and in actuality, the ID devices are positioned on the left and right alternately every substrate.

Example 6

FIG. 6 is a schematic sectional view depicting a configuration of an electronic circuit according to Example 6 of the present invention. The configuration of the Example 6 is the same as that of the Example 1, and an example of a way of holding information by an ID device is shown. The ID device holds information showing which position, that is, which layer each substrate is positioned. The substrates basically have the same configuration, so that the ID devices are used for distinguishing the substrates. Here, four substrates are used, and two wire bondings give the information. In detail, by giving the information (GND, GND), that is, (0, 0) to the first substrate 10, the information (GND, VDD), that is, (0, 1) to the second substrate 20, the information (1, 0) to the third substrate 30, and the information (1, 1) to the fourth substrate 40, the position in stacked layers, that is, the layer of each substrate can be recognized. A signal including this information is transmitted and received as a part of ID of each transmitter-receiver. This information functions as a part of an address of a memory when the substrate is a memory chip.

As a means for giving information to the ID device, a fuse may be selectively laser-cut or may be selectively supplied with a large current and cut. In particular, in DRAM, when a defective bit is found, it is switched with a preparatory cell by using a fuse, and in this case, if fuse cutting for giving information to the ID device is also performed, this is efficient. It is also possible that information (on the layer position of the substrate) is written on a nonvolatile memory (when testing the memory).

Example 7

Figure 7:
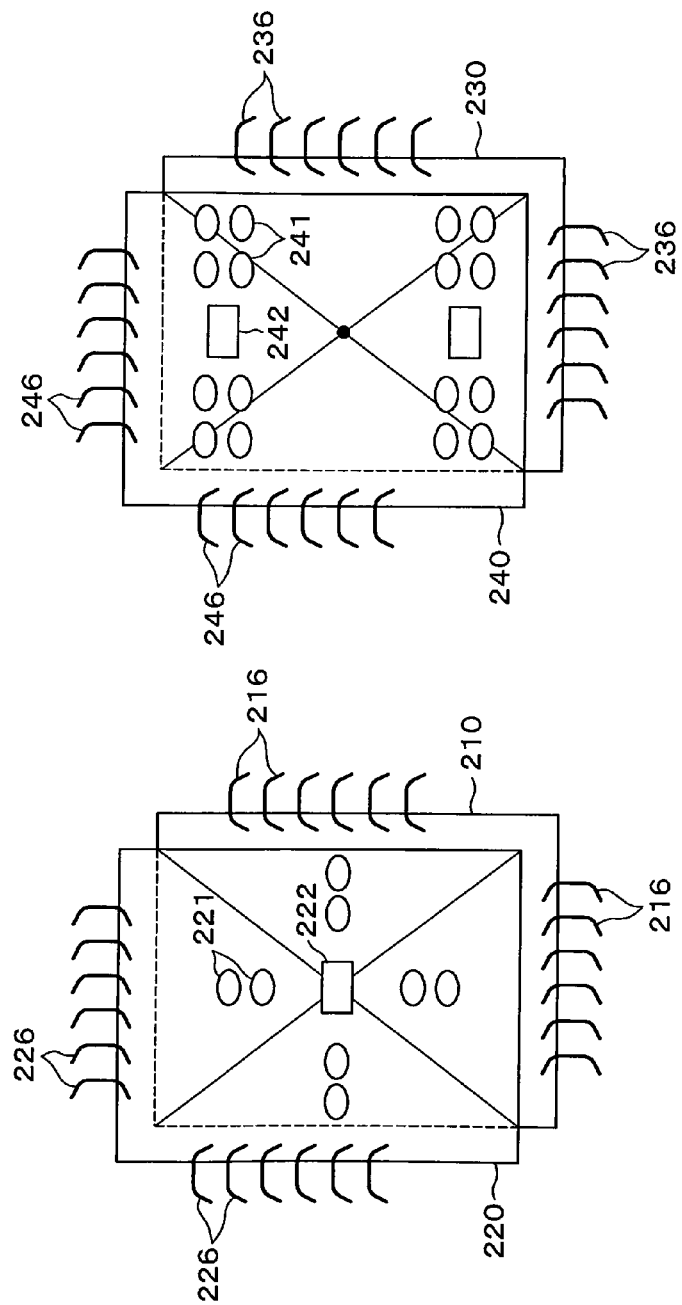
FIG. 7A and FIG. 7B are top views depicting configurations of an electronic circuit according to Example 7 of the present invention.

FIG. 7A and FIG. 7B are top views depicting configurations of electronic circuits according to Example 7 of the present invention. FIG. 7A depicts one example, and FIG. 7B depicts another example. In the Example 7, the substrate 220 includes antennas 221 for data communications and an antenna 222 for control communications. According to control communications, a transmission source, a receiving destination and a communication timing are notified, and a substrate designated as a transmission source transmits data by data communications at the notified communication timing, and a substrate designated as a receiving destination receives the data at the notified communication timing. In control communications, communications are carried out with many substrates, so that it is desirable that the antenna is large and the signal is also large. Therefore, it is desirable that the antenna for control communications is distant from the antennas for data antenna. FIG. 7A depicts an example in which the antenna 222 for control communications is disposed at the center, and antennas 221 for data communications are arranged in parallel to the sides of the substrates and arranged in a cross shape as a whole. FIG. 7B depicts an example in which antennas 242 for control communications are disposed at the upper and lower centers, and antennas 241 for data communications are arranged at four corners of the rectangular substrates.

Example 8

Figure 8:
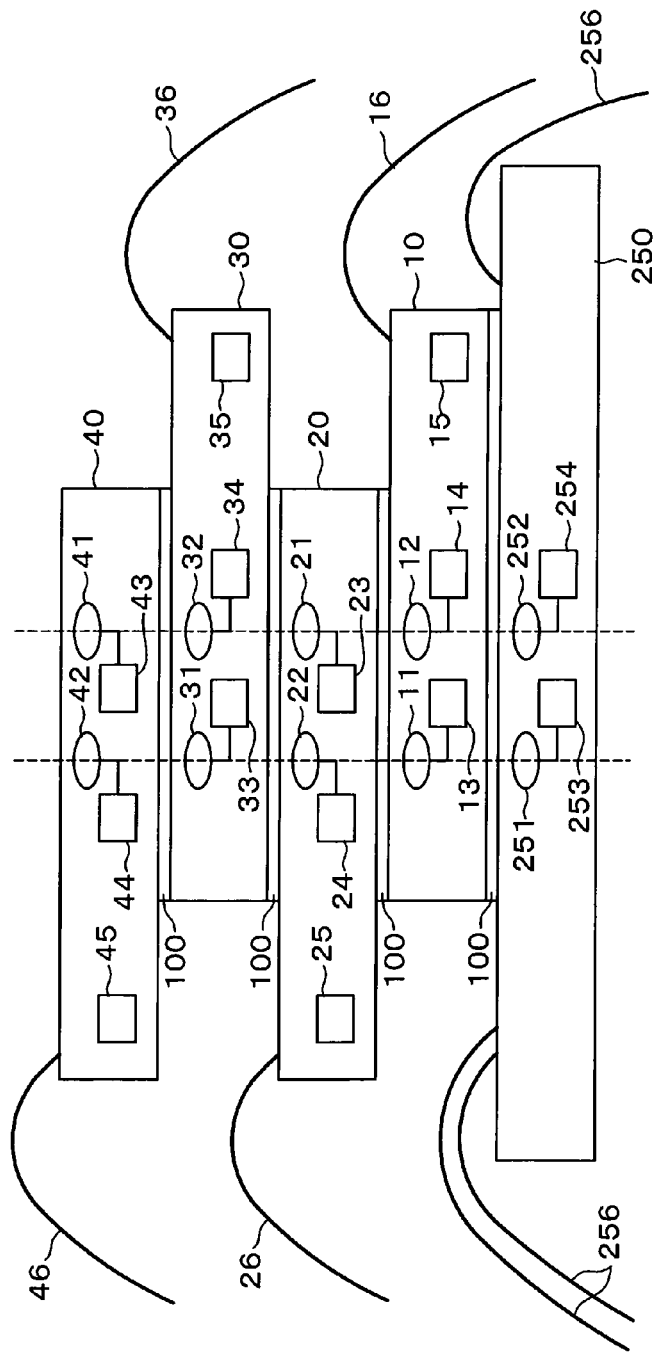
FIG. 8 is a schematic sectional view depicting a configuration of an electronic circuit according to Example 8 of the present invention.

FIG. 8 is a schematic sectional view depicting a configuration of an electronic circuit according to Example 8 of the present invention. The electronic circuit of the Example 8 includes, in addition to the first substrate 10, the second substrate 20, the third substrate 30 and the fourth substrate 40 of the Example 1, a control substrate 250. The control substrate 250 includes a first control antenna 251 overlapping the first antenna 11, a second control antenna 252 overlapping the second antenna 12, and transmitter-receivers 253 and 254 to be connected to the first and second control antennas 251 and 252, and is supplied with power and carries out data communications by wire bondings 256.

When the substrates are stacked by positioning the control substrate 250 as the central layer of the substrates, the maximum distances between the control substrate 250 and other substrates become shorter, and communications become easier. The distances between the control substrate and other substrates are generally long, so that the control antennas are desirably large. Further, when the control substrate 250 is positioned as the top layer or the bottom layer, connection to the outside becomes easier.

FIG. 14 is a view describing communications in the Example 8 of the present invention. First, at a control timing, the control substrate 250 notifies the transmitter-receivers 13, 24, 33 and 44 of transmission commands, receiving commands, and timings of these as control communications by the transmitter-receiver 253. The transmitter-receivers 13, 24, 33 and 44 receive the transmission commands, the receiving commands and the timings of these and carry out data communications according to these. For example, at timing (1), the control substrate 250 transmits data from the outside to the substrate 20, and at timing (2), the substrate 30 transmits data to the control substrate 250 and the control substrate 250 transmits the data to the outside, and at timing (3), the substrate 10 transmits data to the substrate 30.

Example 9

Figure 9:
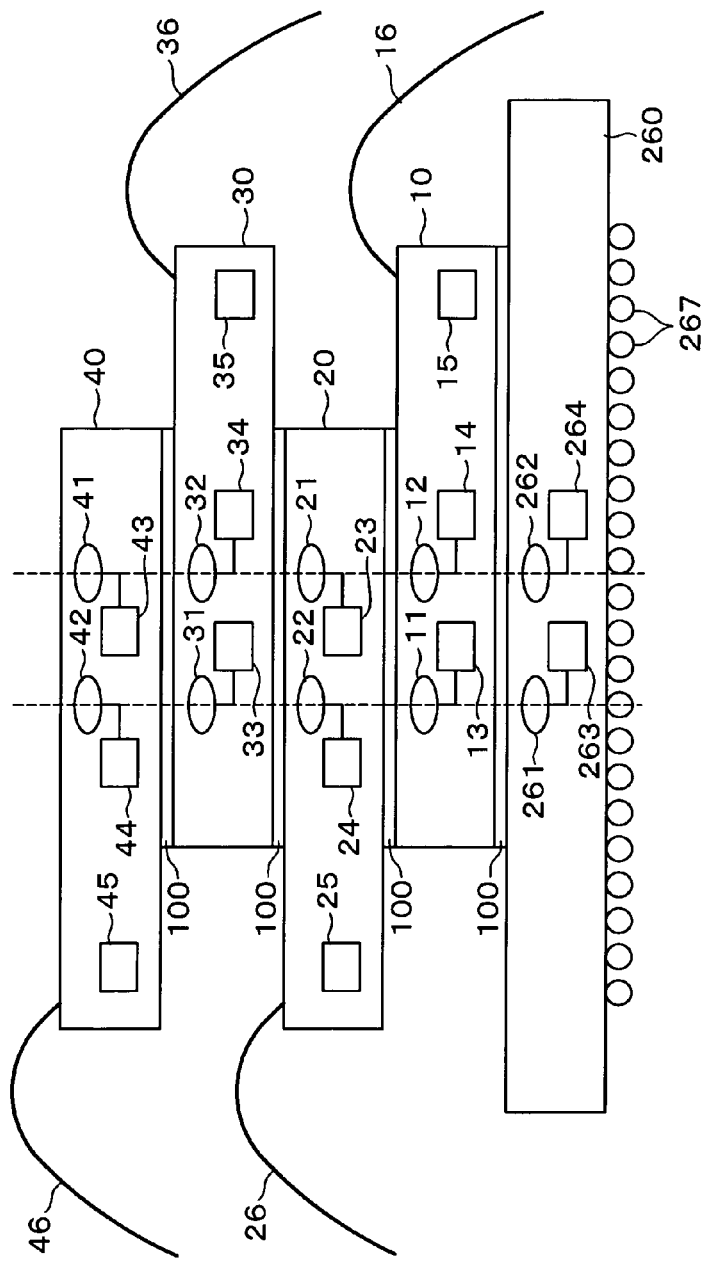
FIG. 9 is a schematic sectional view depicting a configuration of an electronic circuit according to Example 9 of the present invention.

FIG. 9 is a schematic sectional view depicting a configuration of an electronic circuit according to Example 9 of the present invention. Although the control substrate 250 is electrically connected to the outside by the wire bondings 256 in the Example 8, in the electronic circuit of the Example 9, the control substrate 260 is electrically connected to the outside by bumps 267.

Example 10

Figure 10:
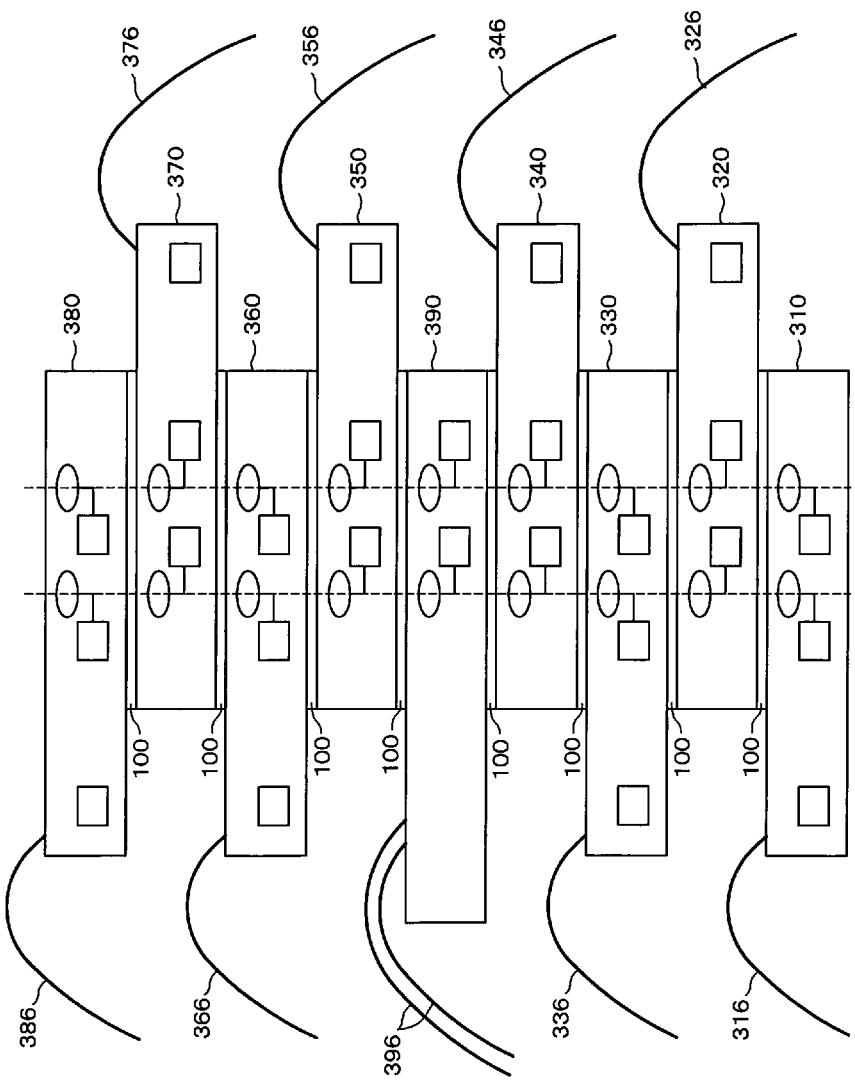
FIG. 10 is a schematic sectional view depicting a configuration of an electronic circuit according to Example 10 of the present invention.

FIG. 10 is a schematic sectional view depicting a configuration of an electronic circuit according to Example 10 of the present invention. The electronic circuit of the Example 10 shows an example in which different types of substrates are mounted on and under the control substrate 390. For example, the substrates 310 to 340 may be used as a CPU and the substrates 350 to 380 may be used as a DRAM. An arbitrary substrate can be an arbitrary type.

Figure 15:
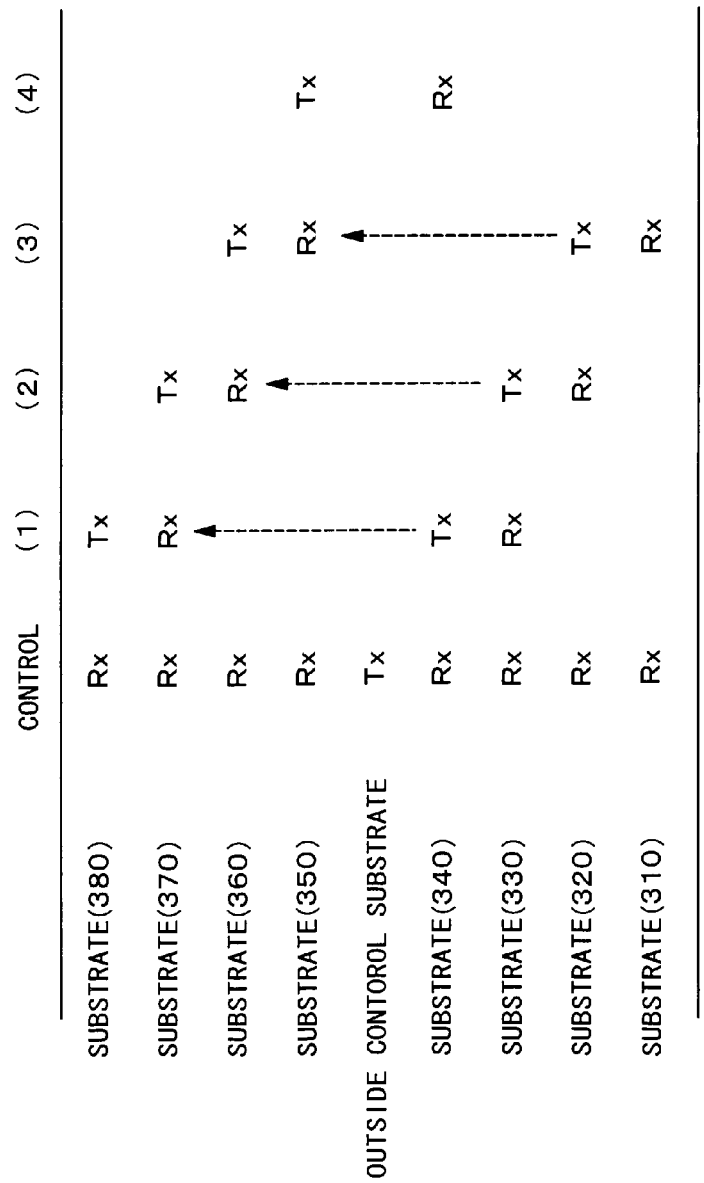
FIG. 15 is a view describing communications in the Example 10 of the present invention.

FIG. 15 is a view describing communications in the Example 10 of the present invention. First, at a control timing, the control substrate 390 notifies the substrates 310 to 340 and 350 to 380 of transmission commands, receiving commands and timings of these as control communications. The substrates 310 to 340 and 350 to 380 receive the transmission commands, the receiving commands and timings of these and according to these, carry out data communications. For example, at timing (1), the substrate 340 transmits data from the outside to the substrate 330, and the substrate 380 transmits data from the outside to the substrate 370. At this time, the substrate 340 which transmits data and the substrate 370 which receives the data are sufficiently distant from each other, so that crosstalk is sufficiently small. At timing (2), the substrate 330 transmits data to the substrate 320, and the substrate 370 transmits data to the substrate 360. At timing (3), the substrate 320 transmits data to the substrate 310, and the substrate 360 transmits data to the substrate 350. At timing (4), the substrate 350 transmits data to the substrate 340.

Example 11

Figure 11:
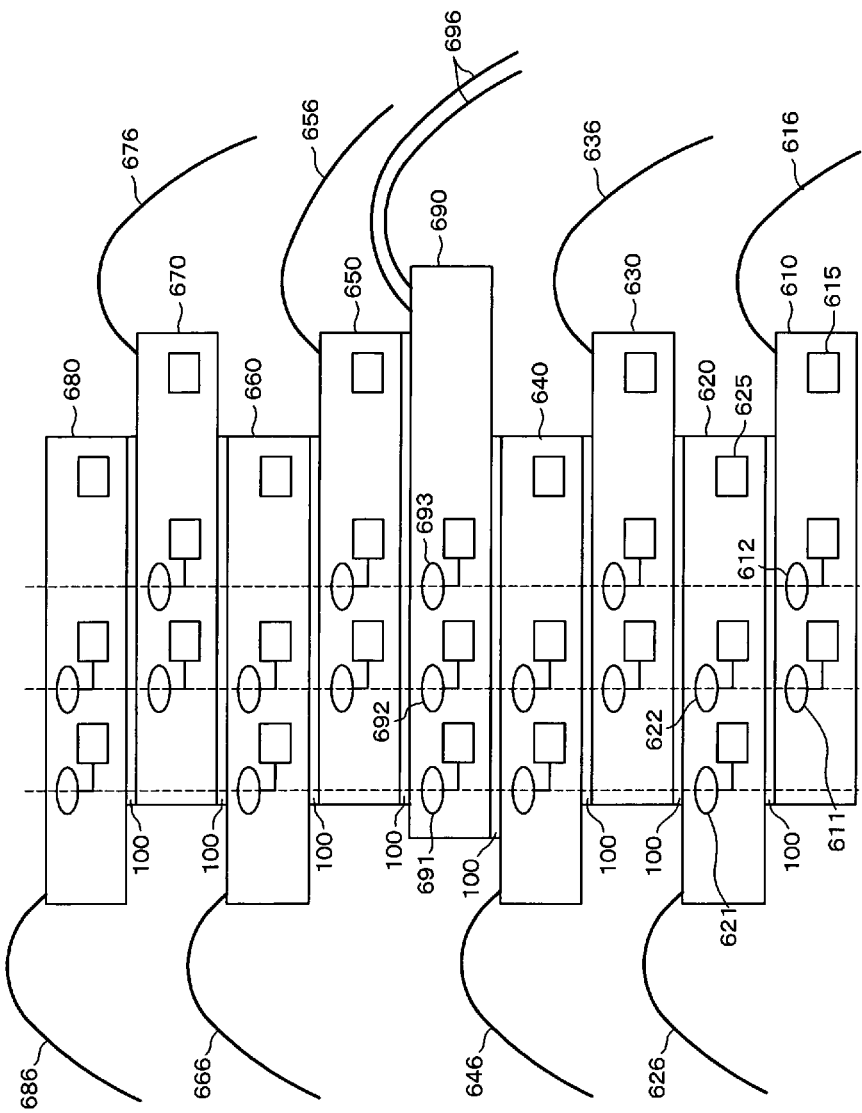
FIG. 11 is a schematic sectional view depicting a configuration of an electronic circuit according to Example 11 of the present invention.

FIG. 11 is a schematic sectional view depicting a configuration of an electronic circuit according to Example 11 of the present invention. Substrates of the type of the Example 1 are mounted on and under the control substrate 390 in the electronic circuit of the Example 10, and on the other hand, in the electronic circuit of the Example 11, substrates of the type of the Example 3 are mounted on and under the control substrate 390. In the case of the electronic circuit of the Example 11, control communications are carried out from the second control antenna 692 via the antenna 611 and the antenna 622, and data communications are carried out from the first control antenna 691 and the third control antenna 693 via the antenna 612 and the antenna 621. Therefore, as described in the Example 3, a substrate can carry out data communications with a substrate alternatively, and the electronic circuit is suitable for this use.

Example 12

Figure 12:
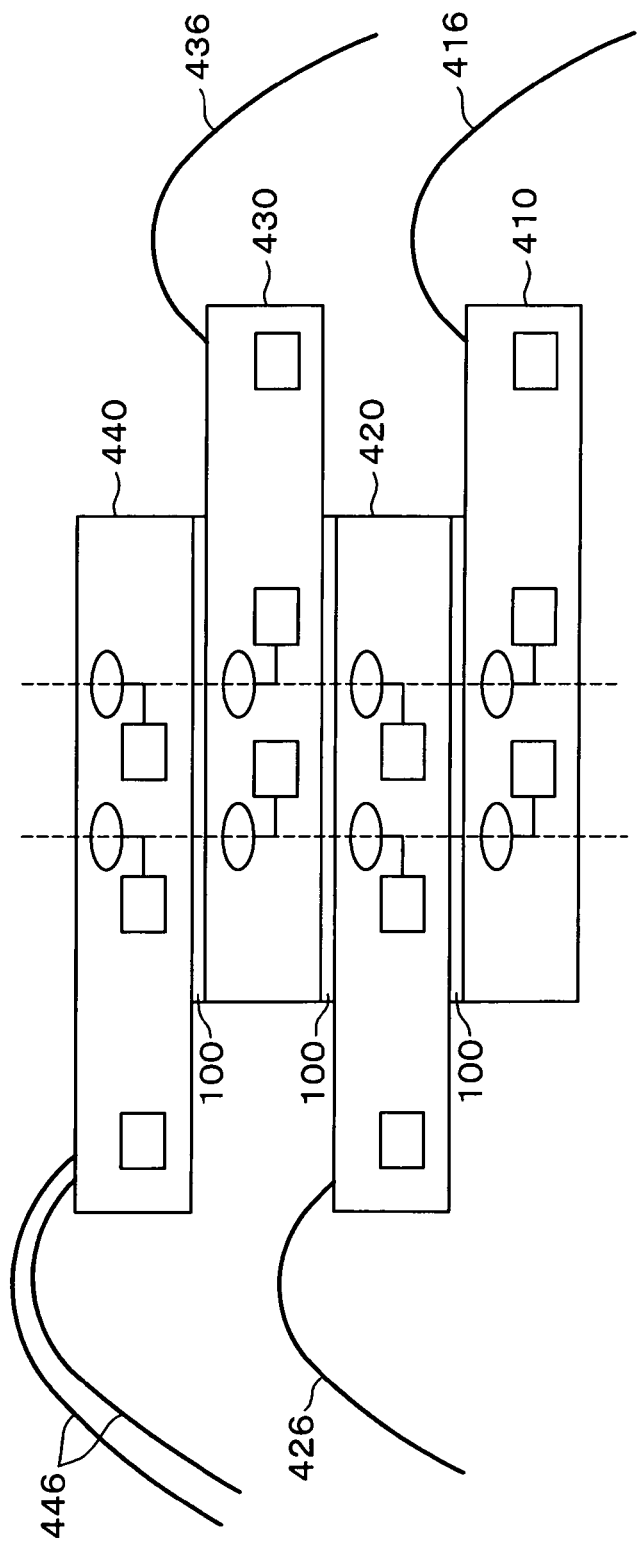
FIG. 12 is a schematic sectional view depicting a configuration of an electronic circuit according to Example 12 of the present invention.

FIG. 12 is a schematic sectional view depicting a configuration of an electronic circuit according to Example 12 of the present invention. The electronic circuit of the Example 12 is an example in which a special control substrate is omitted and a predetermined substrate 440 is used as a control substrate according to a role designation by an ID device.

FIG. 16 is a view describing communications (#1) in the Example 12 of the present invention. First, at a control timing, the substrate 440 notifies the substrates 410, 420, and 430 of transmission commands, receiving commands and timings of these as control communications. The substrates 410, 420 and 430 receive the transmission commands, the receiving commands and the timings of these, and according to these, carry out data communications. For example, at timing (1), the substrate 440 transmits data from the outside to the substrate 420, and at timing (2), the substrate 430 transmits data to the substrate 440 and the substrate 440 transmits the data to the outside, and at timing (3), the substrate 410 transmits data to the substrate 430.

FIG. 17 is a view describing communications (#2) in the Example 12 of the present invention. First, at a control timing, the substrate 440 notifies the substrates 410, 420 and 430 of transmission commands, receiving commands and timings of these as control communications. The substrates 410, 420 and 430 receive the transmission commands, the receiving commands and the timings of these and carry out data communications according to these. For example, at timing (1), the substrate 440 transmits data from the outside to the substrate 430, and at timing (2), the substrate 430 transmits data to the substrate 420, and at timing (3), the substrate 420 transmits data to the substrate 410.

FIG. 18 is a view describing communications (#3) in the Example 12 of the present invention. First, at timing (1), the substrate 440 notifies the substrate 430 of a receiving command and a receiving timing as control communications, and transmits data to the substrate 430 at the notified timing. The substrate 430 receives the data at the notified timing. At timing (2), the substrate 430 notifies the substrate 420 of a receiving command and a receiving timing as control communications, and transmits data to the substrate 420 at the notified timing. The substrate 420 receives the data at the notified timing. At timing (3), the substrate 420 notifies the substrate 410 of a receiving command and a receiving timing as control communications, and transmits data to the substrate 410 at the notified timing. The substrate 410 receives the data at the notified timing.

By thus successively carrying out control communications, the control communication distances can be made shorter. The timings are measured with clocks loaded in the substrates or clocks given to the substrates from the outside by wirings. It is also possible that the end of data transmission is detected by a receiving substrate and transition to the next timing is notified to the next substrate. As another control communication method, it is also possible that at timing (1), the substrate 420 also listens to a control signal from the substrate 440 and prepares for receipt at timing (2).

Example 13

Figure 13:
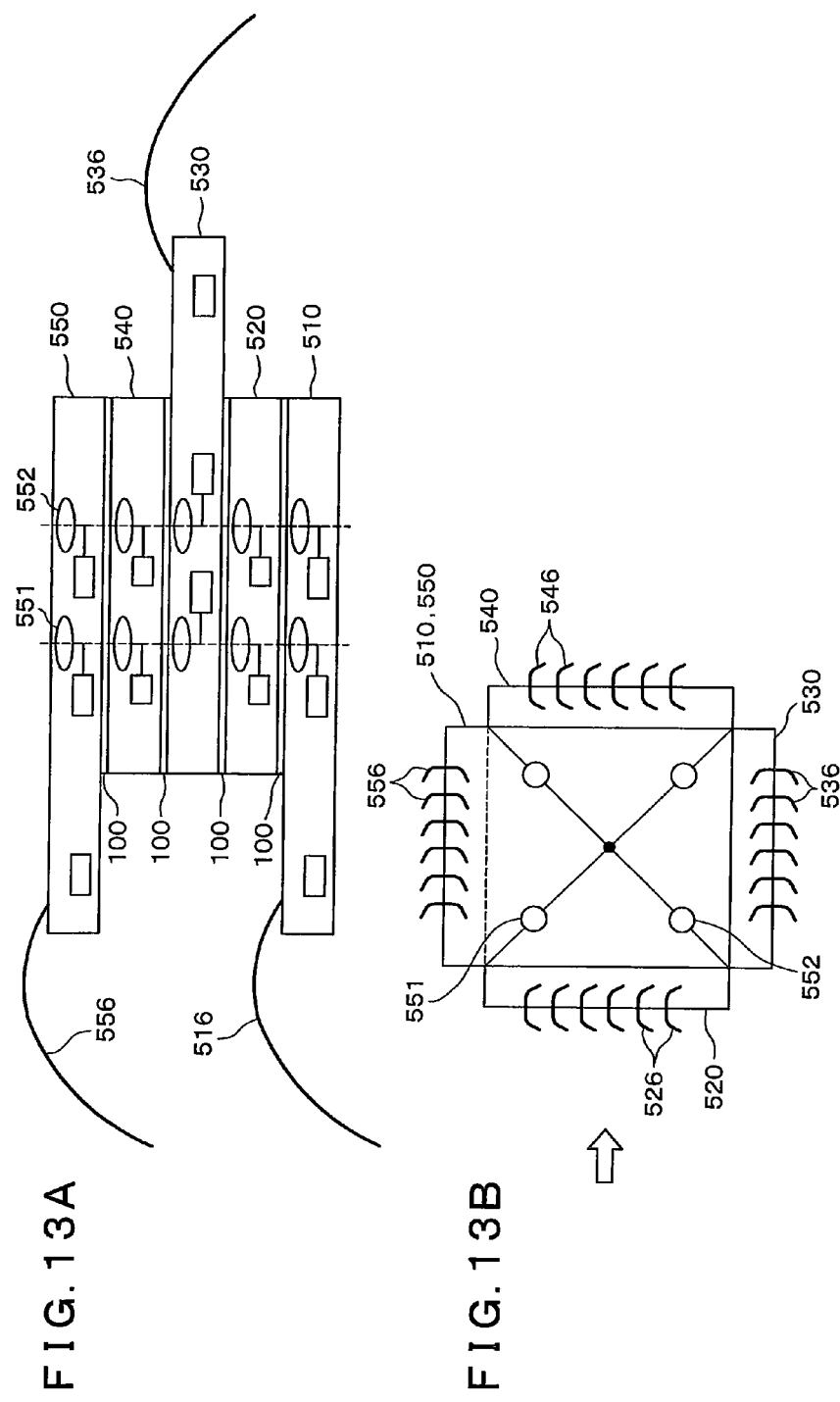
FIG. 13A and FIG. 13B are views depicting a configuration of an electronic circuit according to Example 13 of the present invention.

FIG. 13A and FIG. 13B are views depicting a configuration of an electronic circuit according to Example 13 of the present invention. FIG. 13A is a schematic sectional view of an electronic circuit formed by stacking and mounting from the lateral side. FIG. 13B is a top view of an electronic circuit in a state where five substrates are stacked and mounted. FIG. 13A is a view from the arrow of FIG. 13B. The electronic circuit of the Example 13 includes a ninth substrate 510, a tenth substrate 520, an eleventh substrate 530, a twelfth substrate 540 and a thirteenth substrate 550 which have the same basic configuration as that in the Example 1. The Example 1 shows an example in which the upper substrate is rotated by 180 degrees and slid, however, in the Example 13, the upper substrate is rotated by 90 degrees and slid. Therefore, the antennas 551 and 552 on the upper substrate are disposed at positions overlapping the antennas on the lower substrate by rotating the upper substrate by 90 degrees and slide the upper substrate. Thus, in the Example 13, the upper substrate is rotated by 90 degrees and slide, so that every fourth substrates, that is, the ninth substrate 510 and the thirteenth substrate 550 are disposed in the same direction and at the same position. Therefore, in comparison with the Example 1 in which every second substrates are disposed in the same direction and at the same position, a wider space can be secured for wire bonding of the ninth substrate 510. Therefore, for stacking and mounting a larger number of chips and realizing higher-performance inductive coupling communications, even when the chip thickness is reduced, wire bonding becomes easier than in the Example 1.

Figure 19:
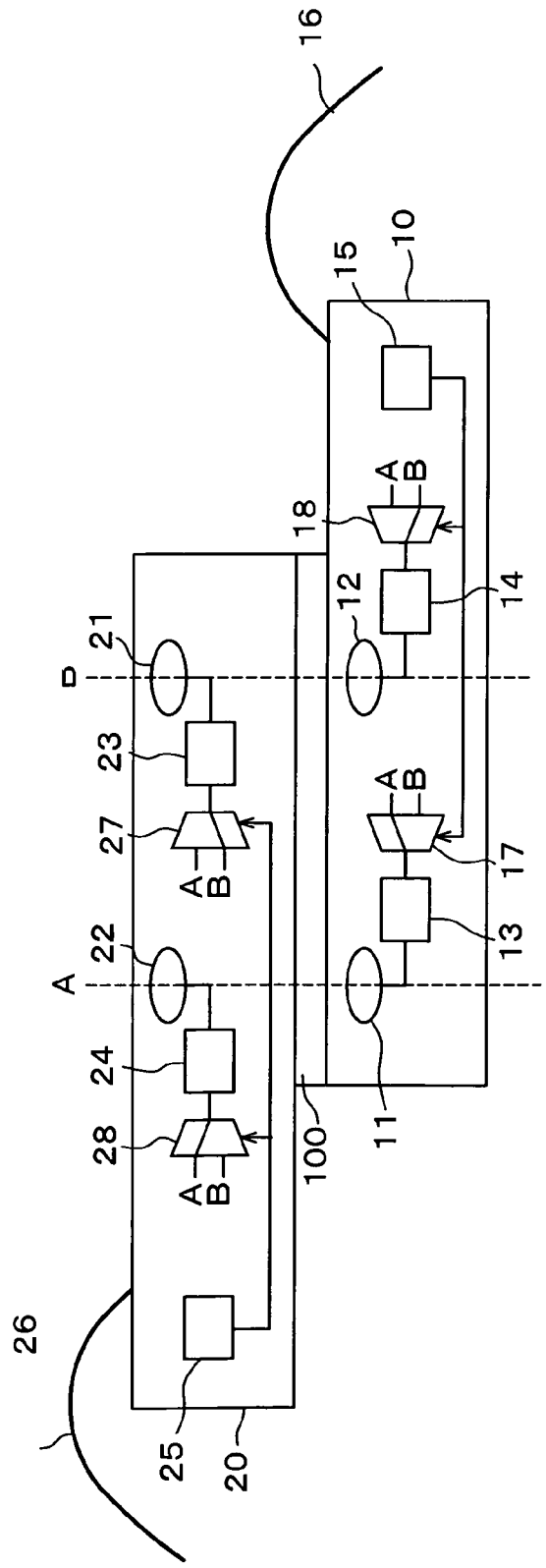
FIG. 19 is a view depicting a configuration of an electronic circuit inside substrates of an example of the present invention.

FIG. 19 is a view depicting a configuration of an electronic circuit inside substrates of an example of the resent invention. Here, the first substrate 10 and the second substrate 20 of the Example 1 will be described. As described in FIG. 1, the first antenna 11 corresponds to the third antenna 21 and the second antenna 12 corresponds to the fourth antenna 22 structurally, however, when they are mounted, the first antenna 11 and the fourth antenna 22 overlap each other and form a channel A, and the second antenna 12 and the third antenna 21 overlap each other and form a channel B. Selectors for assigning the antennas to the channels according to layer positions at which the substrates are mounted so that the communication channels are formed as described above are provided. For example, a first selector 17 is connected to the first transmitter-receiver 13 to be connected to the first antenna 11. The first selector 17 selectively connects the first transmitter-receiver 13 to a circuit corresponding to the channel A and a circuit corresponding to the channel B according to information on the layer position of the substrate from the first ID device 15. Here, the first substrate 10 is the first (odd-number-th) layer from the bottom, so that according to this information, the first selector assigns the first antenna 11 to the channel A, and similarly, the second selector 18 assigns the second antenna 12 to the channel B. The second substrate 20 is the second (even-number-th) layer from the bottom, and according to this information, the third selector 27 assigns the third antenna 21 to the channel B, and similarly, the fourth selector 28 assigns the fourth antenna 22 to the channel A. By assigning channels according to information from the ID device, a communication channel can be formed by antennas disposed at different positions on the substrate. In the case of the Example 1, information on the layer position of the substrate may be information as to whether the substrate is an odd-number-th or an even-number-th substrate from the bottom. In this channel assignment, as in the case of the Example 11 etc., selective assignment to a communication channel or a control channel is also possible.

FIG. 20 is a view depicting a relationship among a coil diameter, a coil-to-coil distance and a signal transmission intensity. FIG. 20 depicts results of simulation of the relationship of S/I (dB) and k (dB), when Y/X=2, 3 and 4, on the vertical axis to D/X on the horizontal axis, provided that:

D: Diameter of transmitter coil and receiver coil

X: Distance between transmitter coil and receiver coil

Y: Distance between another transmitter coil transmitting simultaneously and receiver coil k: Coupling factor between transmitter coil and receiver coil S: Intensity of signal to be received by receiver coil from transmitter coil I: Intensity of interference received by receiver coil from another transmitter coil The following is understood from the graph of FIG. 20. For receiving a signal by a receiver coil from a transmitter coil at a practically necessary intensity, the coils need to have a size (approximately X) not smaller than a predetermined diameter, and for setting an intensity of an interference signal from another transmitter coil so as not to influence the signal reception by the receiver coil, the size of the coils is set to be not more than a predetermined diameter (dependent on Y), and accordingly, a plurality of communications can be simultaneously carried out among four or more coils stacked.

In detail, in the case of synchronous reproduction, noise resistance is strong, so that by setting:

k≥−20 dB (not less than 0.1 in terms of antilogarithm) and
S/I≥10 dB (S/I equals approximately 3 times in terms of antilogarithm),
1≥X/D≥2.5 (when Y/X=2),
≥5(when Y/X=3),
≥7(when Y/X=4)

In the case of asynchronous reproduction, noise resistance is weak, so that by setting:

k≥−20 dB (not less than 0.1 in terms of antilogarithm) and
S/I≥10 dB (S/I equals approximately 10 times in terms of antilogarithm),
1≥X/D 2.1 (when Y/X=3),
3.3 (when Y/X=4), When Y/X=2, no solution is obtained, that is, simultaneous transmission from another transmitter coil satisfying Y/X=2 is prohibited.

Thus, the coil diameter must be set to be not less than a predetermined size corresponding to the distance between a transmitter coil and a receiver coil which communicate with each other, and by setting the size to be not more than a predetermined size dependent on a distance between another transmitter coil simultaneously performing transmission and the receiver coil, a plurality of communications can be simultaneously carried out among four or more coils stacked.

The present invention is not limited to the examples described above.

The antenna includes an electrode of a capacitor for electrostatic induction.

The disclosure of Japanese Patent Application No. 2007-305143, filed on Nov. 26, 2007 including its specification, claims and drawings, is incorporated herein by reference in its entirety.

All the publications, patents and patent applications cited in the present specification are taken in the present specification as references.

The invention claimed is:

1. An electronic circuit comprising:
   a first substrate on which first and second antennas are formed at a predetermined interval; and
   a second substrate which has the same external shape as that of the first substrate, and on which a third antenna is formed at a position of the first antenna formed on the first substrate and a fourth antenna is formed at position of the second antenna formed on the first substrate, and which is stacked and mounted on the first substrate so as to carry out wireless communications between the first antenna and the fourth antenna and have a portion not overlapping the first substrate.

2. The electronic circuit according to claim 1, wherein the first substrate and the second substrate are stacked and mounted in directions 90 degrees or 180 degrees different from each other.

3. An electronic circuit according to claim 1, further comprising:
   a first substrate on which first and second antennas are formed at a predetermined interval;
   a second substrate which has the same external shape as that of the first substrate, and on which third and fourth antennas are formed at positions of the first and second antennas formed on the first substrate, and which is stacked and mounted on the first substrate so as to carry out wireless communications between the first antenna and the fourth antenna and have a portion not overlapping the first substrate; and
   a means for giving information on the layer positions of the first and second substrates to the substrates from the outside.

4. An electronic circuit comprising:
   a first substrate on which first and second antennas are formed at a predetermined interval;
   a second substrate which has the same external shape as that of the first substrate, and on which third and fourth antennas are formed at positions of the first and second antennas formed on the first substrate, and which is stacked and mounted on the first substrate so as to carry out wireless communications between the first antenna and the fourth antenna and have a portion not overlapping the first substrate; and
   a control substrate which includes a control antenna for communicating with the first and fourth antennas, and controls data communications between the first substrate and the second substrate or data communications between the first and second substrates and the outside.

5. The electronic circuit according to claim 4, wherein the control substrate has the same external shape as that of the first and second substrates.

6. The electronic circuit according to claim 4, wherein the control substrate controls data communications with the outside by randomly accessing the first and second substrates.

7. The electronic circuit according to claim 4, wherein the control substrate controls random access data communications between the first and the second substrates.

8. The electronic circuit according to claim 1, further comprising:
   a third substrate which has the same external shape as that of the first and second substrates, on which fifth and sixth antennas are formed at the positions of the first and second antennas formed on the first substrate, and which carries out wireless communications between the third antenna and the sixth antenna, and is stacked and mounted on the second substrate so as to have the second substrate to be sandwiched by the first substrate and the third substrate and have a portion not overlapping the second substrate, wherein
   the electronic circuit carries out successive data transfer from the first substrate to the second substrate according to control by the first substrate and from the second substrate to the third substrate according to control by the second substrate.

9. The electronic circuit according to claim 4, further comprising:
   a third substrate which has the same external shape as that of the first and second substrates, on which fifth and sixth antennas are formed at the positions of the first and second antennas formed on the first substrate, and which carries out wireless communications between the third antenna and the sixth antenna, and is stacked and mounted on the second substrate so as to have the second substrate to be sandwiched by the first substrate and the third substrate and have a portion not overlapping the second substrate, wherein
   the electronic circuit carries out successive data transfer from the first substrate to the second substrate and from the second substrate to the third substrate according to control by the control substrate.

10. The electronic circuit according to claim 1, wherein two or more first substrates and second substrates are alternately stacked and mounted, the first and fourth antennas of the substrates are disposed so as to overlap each other, and a plurality of communications are simultaneously carried out via the antennas separated so as not to cause interference.

11. The electronic circuit according to claim 1, wherein the antennas consist of coils, and include a first coil which transmits a signal to a second coil, the second coil which receives the signal and a third coil which overlaps the first and second coils and is for transmission separately in synchronization with the first coil, and the diameters of the first to third coils are not less than a predetermined diameter corresponding to a distance between the first coil and the second coil, and less than a predetermined diameter by which reception of a signal by the second coil from the third coil remains at an intensity having no influence on reception of a signal from the first coil and which depends on a distance between the second coil and the third coil.

* * * * *